United States Patent
Wu et al.

(10) Patent No.: US 8,674,757 B2
(45) Date of Patent: Mar. 18, 2014

(54) SWITCHING SYSTEM AND METHOD FOR CONTROL THEREOF

(75) Inventors: Li-Te Wu, Hsinchu County (TW); Wei-Chan Hsu, Hsinchu County (TW)

(73) Assignee: NeoEnergy Microelectronic, Inc., Hsinchu County (TW)

( * ) Notice: Subject to any disclaimer, the term of this patent is extended or adjusted under 35 U.S.C. 154(b) by 0 days.

(21) Appl. No.: 13/447,760

(22) Filed: Apr. 16, 2012

(65) Prior Publication Data

US 2013/0106493 A1 May 2, 2013

Related U.S. Application Data

(60) Provisional application No. 61/554,201, filed on Nov. 1, 2011.

(51) Int. Cl.
*H02M 7/162* (2006.01)

(52) U.S. Cl.
USPC ........... 327/588; 327/587; 327/494; 327/434; 327/124

(58) Field of Classification Search
USPC ......... 327/108, 110, 124, 168, 427, 434, 493, 327/494, 504, 583, 587, 588; 323/268, 269
See application file for complete search history.

(56) References Cited

U.S. PATENT DOCUMENTS

| | | | | |
|---|---|---|---|---|
| 4,710,686 A | * | 12/1987 | Guzik | 318/293 |
| 5,377,094 A | * | 12/1994 | Williams et al. | 363/132 |
| 5,469,095 A | * | 11/1995 | Peppiette et al. | 327/110 |
| 5,952,856 A | * | 9/1999 | Horiguchi et al. | 327/110 |
| 5,986,832 A | * | 11/1999 | Barnett | 360/46 |
| 6,052,017 A | * | 4/2000 | Pidutti et al. | 327/424 |
| 7,408,313 B1 | * | 8/2008 | Kong et al. | 318/293 |
| 7,746,123 B2 | | 6/2010 | Hester et al. | |
| 2013/0049823 A1 | * | 2/2013 | Iwasaki | 327/124 |

OTHER PUBLICATIONS

Patrick P. Siniscalchi et al, A 20 W/Channel Class-D Amplifier With Near-Zero Common-Mode Radiated Emissions, IEEE Journal of Solid-State Circuits, Dec. 2009, pp. 3264-3271, vol. 44, No. 12.

* cited by examiner

*Primary Examiner* — Lincoln Donovan
*Assistant Examiner* — Jung H Kim
(74) *Attorney, Agent, or Firm* — Muncy, Geissler, Olds & Lowe, P.C.

(57) ABSTRACT

The invention provides a switching system. The switching system comprises an H bridge, a current router, and a control circuit. The H bridge comprises a first switch and a second switch coupled to a first output node and a third switch and a fourth switch coupled to a second output node, wherein a load is coupled between the first output node and the second output node. The current router comprises a first shunt switch and a second shunt switch coupled between the first output node and the second output node. The control circuit generates a first control signal to control the first switch and the fourth switch, generates a second control signal to control the second switch and the third switch, generates a third control signal to control the first shunt switch, and generates a fourth control signal to control the second shunt switch.

7 Claims, 18 Drawing Sheets

SWITCHING SYSTEM AND METHOD FOR CONTROL THEREOF

CROSS REFERENCE TO RELATED APPLICATIONS

This application claims the benefit of U.S. Provisional Application No. 61/554,201, filed on Nov. 1, 2011, the entirety of which is incorporated by reference herein.

BACKGROUND OF THE INVENTION

1. Field of the Invention

The invention relates to H-bridges, and more particularly to Electro-Magnetic-Interference (EMI) of H-bridges.

2. Description of the Related Art

A switching amplifier, which is referred to as a class-D amplifier, is frequently used as an audio amplifier due to high power conversion efficiency. The power conversion efficiency of a switching amplifier can achieve 95% or higher while that of a class-AB amplifier is usually less than 80%. Thus, a switching amplifier has power conversion efficiency higher than that of the class-AB amplifier, and a system using a switching amplifier has a longer battery playback time than that of a system using a class-AB amplifier.

The major drawback of a switching amplifier is related to high electro-magnetic interference (EMI). The EMI problem can be solved by using an L-C (inductor-capacitor) filter. The side effect is that the inductor is bulky, non-linear, and consumes power (inductor has inherent parasitic resistance). The rapid switching mechanism of a switching amplifier induces an electro-magnetic interference (EMI) problem that can interfere and cause errors to the electronic circuits near the switching amplifier.

A switching amplifier tied with a load forms a circuit with a shape of the character H and is referred to as an H bridge. Referring to FIG. 1, a circuit diagram of a conventional H-bridge is shown. The H bridge has a first output node OUTP and a second output node OUTM, and a load is coupled between the output nodes OUTP and OUTM of the H bridge. The H bridge comprises four switches M1, M2, M3, and M4. The first switch M1 is coupled between a voltage source VDD and the first output node OUTP, the second switch M2 is coupled between the first output node OUTP and ground GND, the third switch M3 is coupled between the voltage source VDD and the second output node OUTM, and the fourth switch M4 is coupled between the second output node OUTM and ground GND.

The switches M1, M2, M3, and M4 respectively have body diodes DM1, DM2, DM3, and DM4. Four control signals GD1, GD2, GD3, and GD4 are respectively coupled to the gates of the transistors M1, M2, M3, and M4 to turn off or turn on the transistors M1, M2, M3, and M4. The control signals GD1, GD2, GD3, and GD4 are generated according to pulse-width modulation (PWM). Among different modulation schemes of PWM, BD modulation is widely used due to lower EMI and high efficiency. The advantage of this invention over conventional BD modulation will be explained in detail. In a conventional Class-BD PWM, the voltages on the output nodes OUTP and OUTM, the voltage across the load (OUTP−OUTM), and the common mode voltage ½(OUTP+OUTM) are determined by the On-off states of the switches GD1, GD2, GD3, and GD4 and are summarized in the following table:

TABLE 1

| M1 | M3 | M2 | M4 | Voltage at OUTP | Voltage at OUTM | Voltage across load | Common mode voltage |
|---|---|---|---|---|---|---|---|
| On | On | Off | Off | VDD | VDD | 0 | VDD |
| On | Off | Off | On | VDD | GND | VDD | ½VDD |
| Off | On | On | Off | GND | VDD | −VDD | ½VDD |
| Off | Off | On | On | GND | GND | 0 | 0 |

The common mode voltage also has three levels: VDD, ½VDD, and 0. The common mode voltage switches with the PWM clock, and the fast switching wave produces significant EMI radiation in the 30-1000 MHz range. This EMI can be suppressed by the LC filters coupled between the output nodes (OUTP and OUTM) and the GND. The added filters increase the cost and size of the switching system. Hence it is desirable to find solutions to reduce common mode switching noise. In addition, rapid fluctuation of voltages on the output nodes OUTP and OUTM induces large EMI effects which further degrades performance of the switching system. Thus, a new switching system avoiding rapid fluctuation of voltages on the output nodes OUTP and OUTM is therefore required.

BRIEF SUMMARY OF THE INVENTION

The invention provides a switching system. In one embodiment, the switching system comprises an H bridge and a current router. The H bridge comprises a first switch, a second switch, a third switch, and a fourth switch. The first switch is coupled between a voltage source and a first output node, and has a gate coupled to a first control signal. The second switch is coupled between the first output node and a ground, and has a gate coupled to a second control signal. The third switch is coupled between the voltage source and a second output node, and has a gate coupled to the second control signal. The fourth switch is coupled between the second output node and the ground, and has a gate coupled to the first control signal. A load is coupled between the first output node and the second output node. The current router comprises a first shunt switch and a second shunt switch. The first shunt switch is coupled between the first output node and a first node, and has a gate coupled to a third control signal. The second shunt switch is coupled between the second output node and the first node, and has a gate coupled to a fourth control signal, wherein the body diode of the first shunt switch has a direction inverse to that of the body diode of the second shunt switch.

The invention also provides a method for controlling a switching system. In one embodiment, the switching system comprises an H bridge and a current router, the H ridge comprises a first switch and a second switch coupled to a first output node and a third switch and a fourth switch coupled to a second output node, the current router comprises a first shunt switch and a second shunt switch coupled between the first output node and the second output node, and a load is coupled between the first output node and the second output node. First, the switching system is enabled to operate according to a second state by turning on the first switch, the fourth switch, and the first shunt switch, and turning off the second switch, the third switch, and the second shunt switch. The switching system is then enabled to operate according to a first state by turning on the first shunt switch, and turning off the first switch, the second switch, the third switch, the fourth switch, and the second shunt switch. The switching system is then enabled to operate according to a zero state by turning on the first shunt switch and the second shunt switch, and turning off the first switch, the second switch, the third switch, and the fourth switch. The switching system is then enabled to operate according to an inverse first state by turning on the second shunt switch, and turning off the first switch, the second switch, the third switch, the fourth switch, and the first shunt switch. The switching system is then enabled to operate according to an inverse second state by turning on the second switch, the third switch, and the second shunt switch, and turning off the first switch, the fourth switch, and the first shunt switch.

The invention provides a switching system. In one embodiment, the switching system comprises an H bridge, a current router, and a control circuit. The H bridge comprises a first switch and a second switch coupled to a first output node and a third switch and a fourth switch coupled to a second output node, wherein a load is coupled between the first output node and the second output node. The current router comprises a first shunt switch and a second shunt switch coupled between the first output node and the second output node. The control circuit generates a first control signal to control the first switch and the fourth switch, generates a second control signal to control the second switch and the third switch, generates a third control signal to control the first shunt switch, and generates a fourth control signal to control the second shunt switch.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
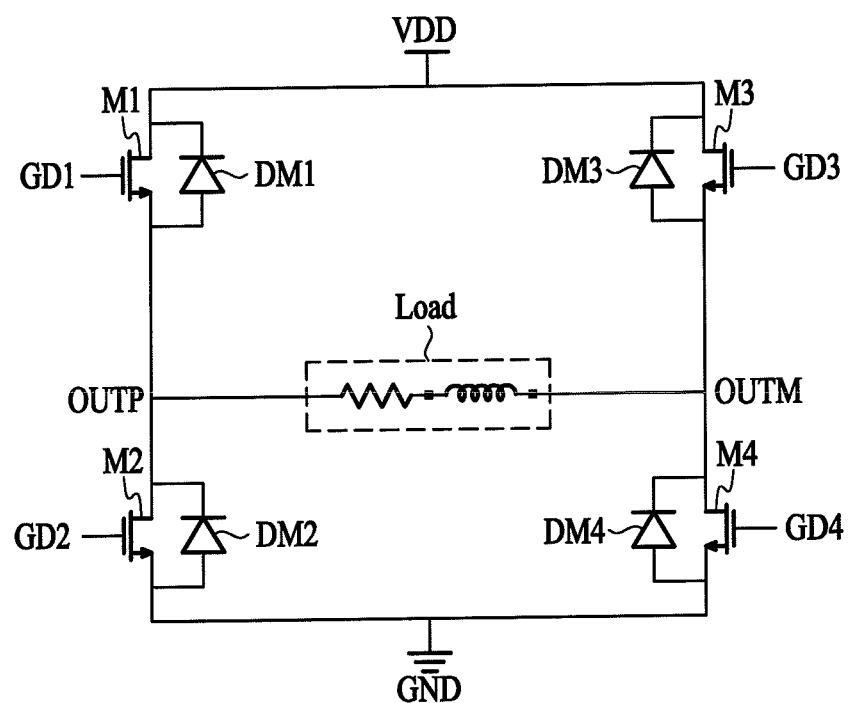
FIG. 1 is a circuit diagram of a conventional H-bridge.
Figure 2A:
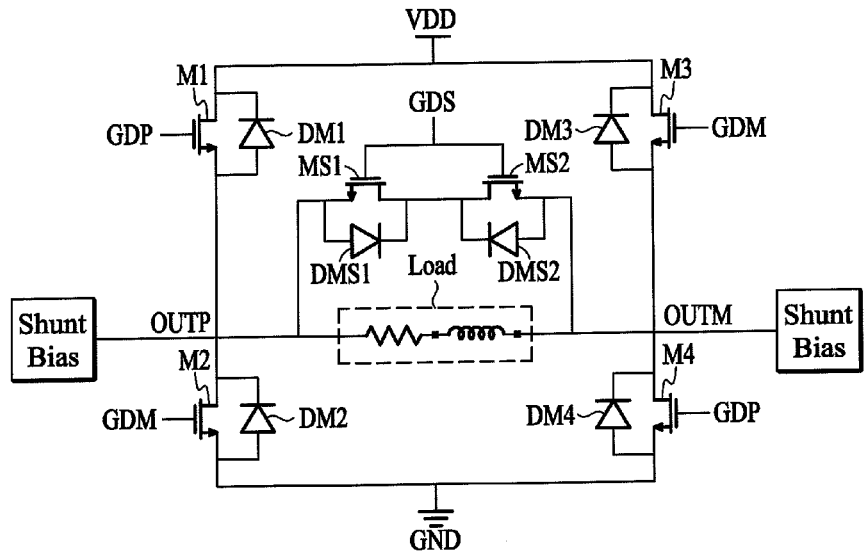
FIG. 2A is a circuit diagram of an improved H bridge.

To clamp the common mode voltage on the output nodes OUTP and OUTM, an improved H bridge is provided. Referring to FIG. 2A, a circuit diagram of an improved H bridge is shown. The improved H bridge also comprises switches M1, M2, M3, and M4. A shunt bias circuit clamps the voltages on the output nodes OUTP and OUTM to be equal to ½VDD. In addition, two shunt switches MS1 and MS2 are coupled between the output nodes OUTP and OUTM. A control signal GDP controls the switches M1 and M4, a control signal GDM controls the switches M2 and M3, and a control signal GDS controls the shunt switches MS1 and MS2. The improved H bridge can operate according to three different states S2, S-2, and S0. The voltages of the improved H bridge operating according to the three states are shown in the following table:

TABLE 2

| State | GDP | GDM | GDS | Voltage at OUTP | Voltage at OUTM | Voltage across load | Common mode voltage |
|---|---|---|---|---|---|---|---|
| S2 | 1 | 0 | 0 | VDD | GND | VDD | ½VDD |
| S-2 | 0 | 1 | 0 | GND | VDD | −VDD | ½VDD |
| S0 | 0 | 0 | 1 | BIAS | BIAS | 0 | ½VDD |

As shown in Table 2, the common mode voltage is always equal to ½VDD if we set the shunt bias voltage to ½VDD. The common mode voltage fluctuation described in Table 1 no longer exits to mitigate the EMI. According to BD modulation, the state S0 always occurs between states S2 and S-2. The timing control of the gate voltages GDP, GDM and GDS is very critical to reduce EMI and to avoid short circuit between the VDD and GND. For example, consider that the state of the H bridge is changed from S2 to S0. If the control signal GDS is enabled (set to a high level) before the GDP is disabled (set to low level), there is an over-lapping period in which switches M1, MS1, MS2 and M4 are all turned on, and a direct current path between VDD and GND is formed to induce a shoot-through condition that potentially can damage a device. To avoid this problem, a dead time state in which the control signal GDP is disabled before the control signal GDS is enabled and is typically inserted between the states S2 and S0. As explained below, the problem with the dead-time state insertion is that there may be a sudden jump in the voltages on the output nodes OUTP and OUTM, and the voltage jump induces EMI.

Figure 2B:
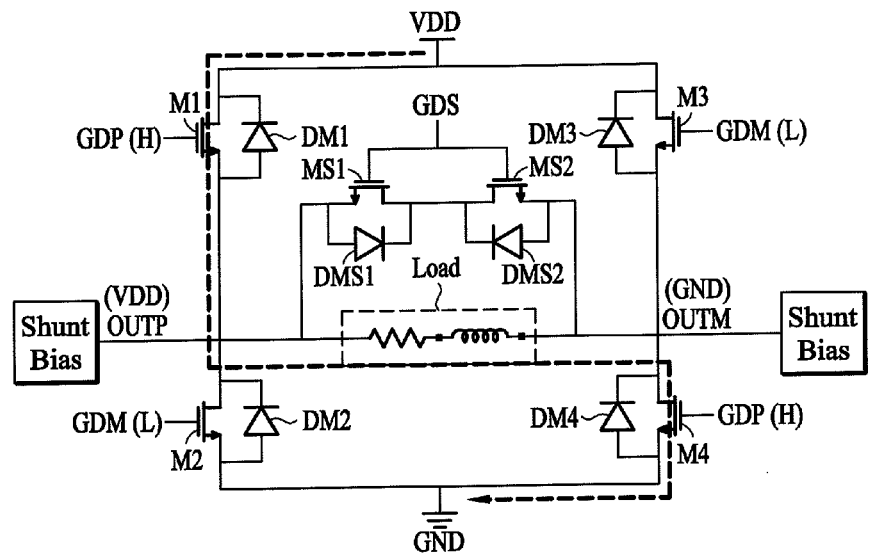
FIGS. 2B, 2C, and 2D show current paths of the improved H bridge shown in FIG. 2A.
Figure 2C:
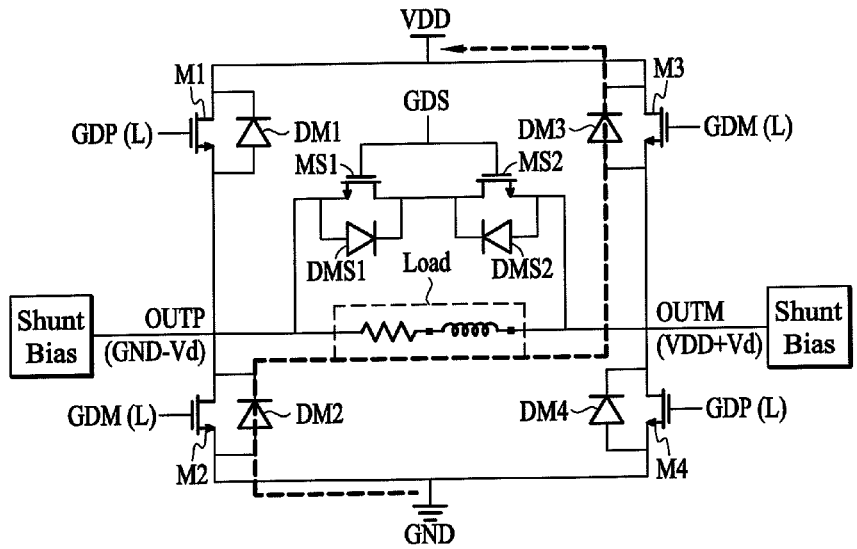
Figure 2D:
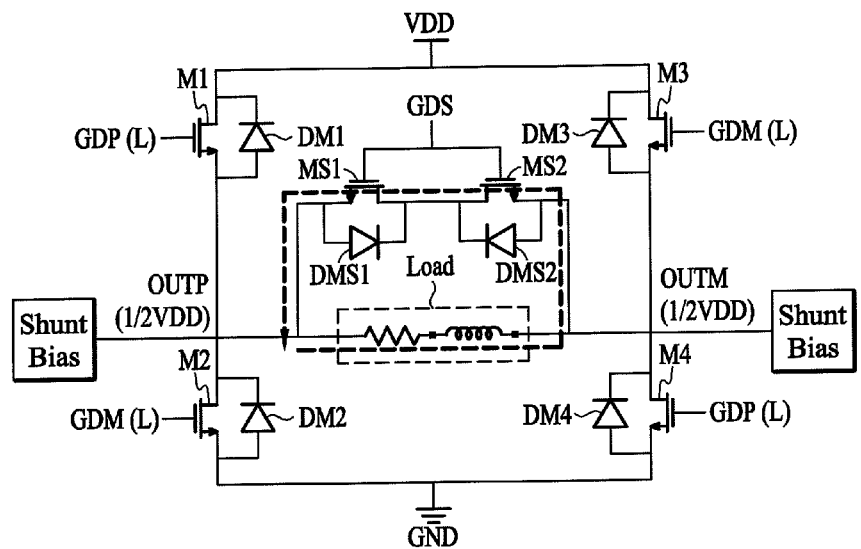

FIGS. 2B, 2C, and 2D show the current flowing through the H bridge operating according to state S2, a dead-time state, and state S0. As shown in FIG. 2B, the H bridge operates according to the state S2, the control signal GDP is enabled, and the control signals GDM and GDS are disabled. The voltage on the node OUTP is VDD, the voltage on the node OUTM is GND, and the current flows from the node OUTP to the node OUTM. The H bridge is then controlled to operate according to the dead-time state, as shown in FIG. 2C. All switches are turned off. Since the current flowing through the inductor must be continuous in time. The current flowing from the node OUTP to the node OUTM through the inductor therefore finds a path through the body diodes DM2 and DM3 of the switches M2 and M3. The voltage on the node OUTP is therefore forced to jump to GND−Vd, and the voltage on the node OUTM is forced to jump to VDD+Vd, wherein the voltage Vd is the forward bias voltage of the body diodes DM2 and DM3.

Figure 2E:
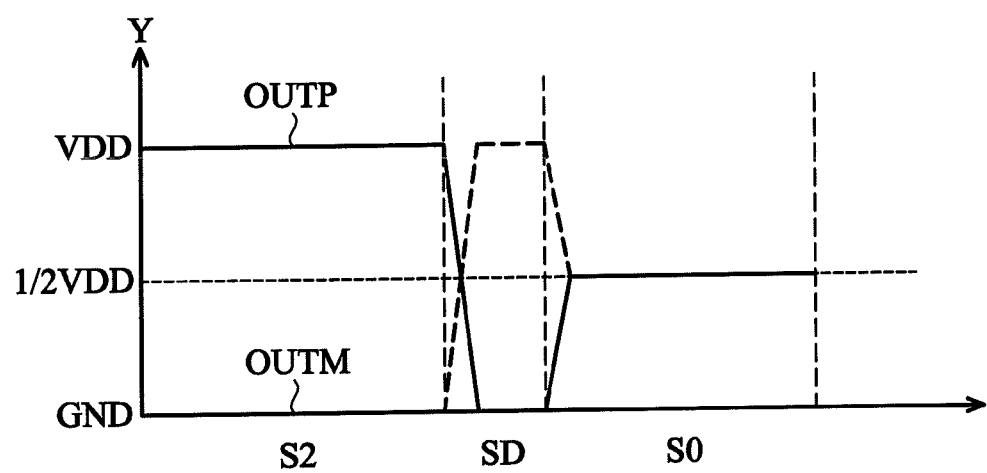
FIG. 2E is a diagram of wave forms of voltages on the output nodes of the improved H-bridge shown in FIG. 2A.

The H bridge is then controlled to operate according to the state S0, as shown in FIG. 2D. The control signal GDS is enabled to turn on the shunt switches MS1 and MS2. The current then circulates through the load and the shunt switches MS1 and MS2, and the voltages on the output nodes OUTP and OUTM are both equal to ½VDD. Referring to FIG. 2E, a diagram of wave forms of voltages on the output nodes OUTP and OUTM of the H-bridge is shown. The voltage on the node OUTP is first equal to VDD at state S2, and then jumps to GND at the dead-time state SD, and then jumps to ½VDD at state S0. The voltage on the node OUTM is first equal to GND at state S2, and then jumps to VDD at the dead-time state SD, and then jumps to ½VDD at state S0. The rapid fluctuation of voltages on the output nodes OUTP and OUTM also induces EMI and therefore degrades the performance of the switching system. Thus, a new switching system avoiding rapid fluctuation of voltages on the output nodes OUTP and OUTM is therefore required.

Figure 3:
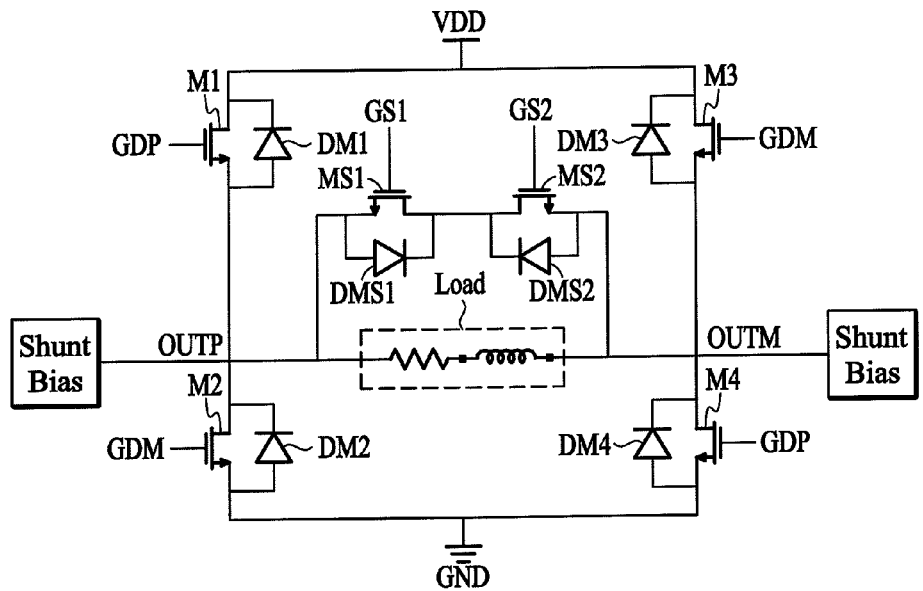
FIG. 3 is a block diagram of a switching circuit according to the invention.

Referring to FIG. 3, a block diagram of a switching circuit according to the invention is shown. The switching circuit comprises an H bridge comprising four switches M1, M2, M3, and M4, and a current router comprising two shunt switches MS1 and MS2. The switches M1, M2, M3, and M4 respectively have body diodes DM1, DM2, DM3, and DM4. The shunt switches MS1 and MS2 respectively have body diodes DMS1 and DMS2. The H bridge has two output nodes OUTP and OUTM. A load is coupled between the output nodes OUTP and OUTM. The switch M1 is coupled between a voltage source VDD and the output node OUTP. The switch M2 is coupled between the output node OUTP and a ground. The switch M3 is coupled between the voltage source VDD and the output node OUTM. The switch M4 is coupled between the output node OUTM and the ground. The shunt switches MS1 and MS2 are coupled between the output nodes OUTP and OUTM, and the direction of the body diode DMS1 of the shunt switch MS1 is inverse to that of the body diode DMS2 of the shunt switch MS2. A control circuit (not shown in FIG. 3) generates four control signals GDP, GDM, GS1, and GS2. The gates of the switches M1 and M4 are coupled to the control signal GDP. The gates of the switches M2 and M3 are coupled to the control signal GDM. The gates of the shunt switches MS1 and MS2 are respectively coupled to the control signals GS1 and GS2.

Comparing to the improved H bridge shown on FIG. 2A operated with three states (Table 2), t this invention porposes a switching circuit operates according to a current state selected from five states S0, S1, S-1, S2, and S-2. In FIG. 3, the control signals GDP, GDM, GS1, and GS2 have different values to individually turn on or off the switches M1, M2, M3, and M4 and the shunt switches MS1 and MS2. Table 3 shown in the following discloses the values of the control signals GDP, GDM, GS1, and GS2 corresponding to the five states S0, S1, S-1, S2, and S-2:

TABLE 3

| State | GDP | GDM | GS1 | GS2 |
|-------|-----|-----|-----|-----|
| S2    | 1   | 0   | 1   | 0   |
| S-2   | 0   | 1   | 0   | 1   |
| S1    | 0   | 0   | 1   | 0   |
| S-1   | 0   | 0   | 0   | 1   |
| S0    | 0   | 0   | 1   | 1   |

For example, when the switching circuit operates according to the state S2, the control signal GDP is enabled to turn on the switches M1 and M4, the control signal GDM is disabled to turn off the switches M2 and M3, the control signal GS1 is enabled to turn on the shunt switch MS1, and the control signal GS2 is disabled to turn off the shunt switch MS2. When the switching circuit operates according to the state S1, the control signal GDP is disabled to turn off the switches M1 and M4, the control signal GDM is disabled to turn off the switches M2 and M3, the control signal GS1 is enabled to turn on the shunt switch MS1, and the control signal GS2 is disabled to turn off the shunt switch MS2. When the switching circuit operates according to the state S0, the control signal GDP is disabled to turn off the switches M1 and M4, the control signal GDM is disabled to turn off the switches M2 and M3, the control signal GS1 is enabled to turn on the shunt switch MS1, and the control signal GS2 is enabled to turn on the shunt switch MS2.

Comparing Table 3 to Table 2, this invention introduced two extra states S1 and S-1. In State S1, the current can only flow from OUTM to OUTP while in State S-1, the current can only flow from OUTP to OUTM. Hence the composite shunt switch MS1 and MS2 is referred as the current router. By inserting states S1 and S-1 properly between other states, the current router can steer the current flow properly and prevent the abrupt node voltage transition as shown in FIG. 2E.

Figure 4:
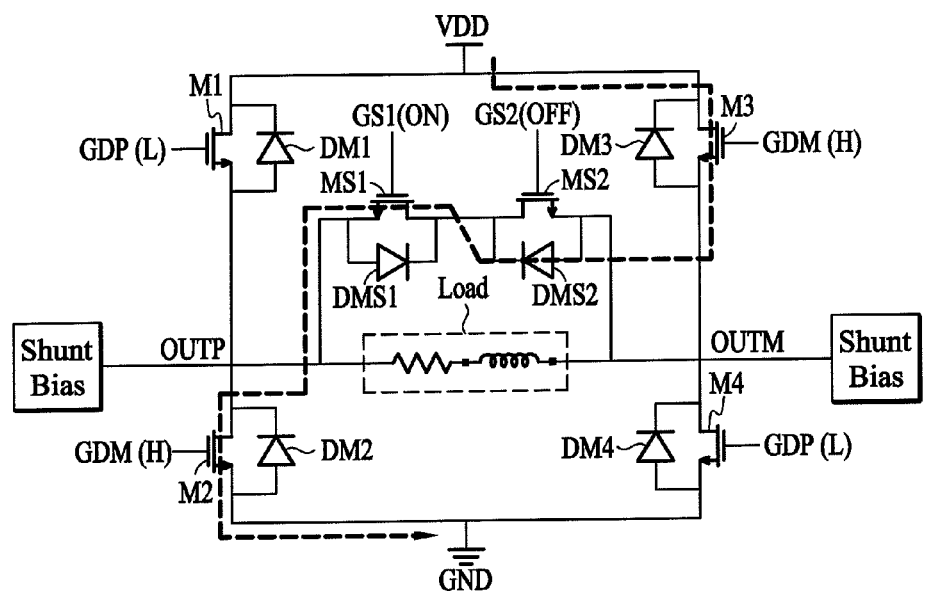
FIG. 4 shows a direct current path from a voltage source through the switching circuit to a ground.

In addition to the states S0, S1, S-1, S2, S-2, there are also other states corresponding to different values of the control signals GDP, GDM, GS1, and GS2. The switching circuit, however, is forbidden to operate according to these states, because in these states a direct current path from the voltage source VDD to the ground GND is generated to induce current shoot-through. For example, as shown in FIG. 4, the control signal GDP is disabled, the control signal GDM is enabled, the control signal GS1 is enabled, and the control signal GS2 is disabled. The switches M2 and M3 and the shunt switch MS1 are therefore turned on, and the shunt switch MS2 is turned off. A direct current path from the voltage source through the switch M3, the body diode DMS2 of the shunt switch MS2, the shunt switch MS1, and the switch M2 to the ground GND is therefore formed. The current path may lead to damage of the switching circuit and the state of FIG. 4 is therefore abandoned.

As shown in Table 3, except for the state S0 in which both the shunt switches MS1 and MS2 are turned on, the shunt switch MS1 is turned on when the shunt switch MS2 is turned off, and the shunt switch MS2 is turned on when the shunt switch MS1 is turned off. The purpose of turning on only one of the shunt switches MS1 and MS2 is to provide a current path when the voltage of one of the output nodes GDP and GDM changes from a logic high level to a logic low level. During the voltage transition, there is a short period in which both the voltages of the output nodes GDP and GDM are equal to 0, referred to as a dead-time period. By properly inserting the State S1 or S-1 and turning on one of the shunt switches MS1 and MS2 in advance, the load current has a path to flow through the shunt switch, such that the voltage of the output nodes OUTP and OUTM is prevented from rapidly changing from a logic high level to a logic low level, as shown in FIG. 2E, hence the EMI associated with this rapid transition is greatly reduced.

Figure 5A:
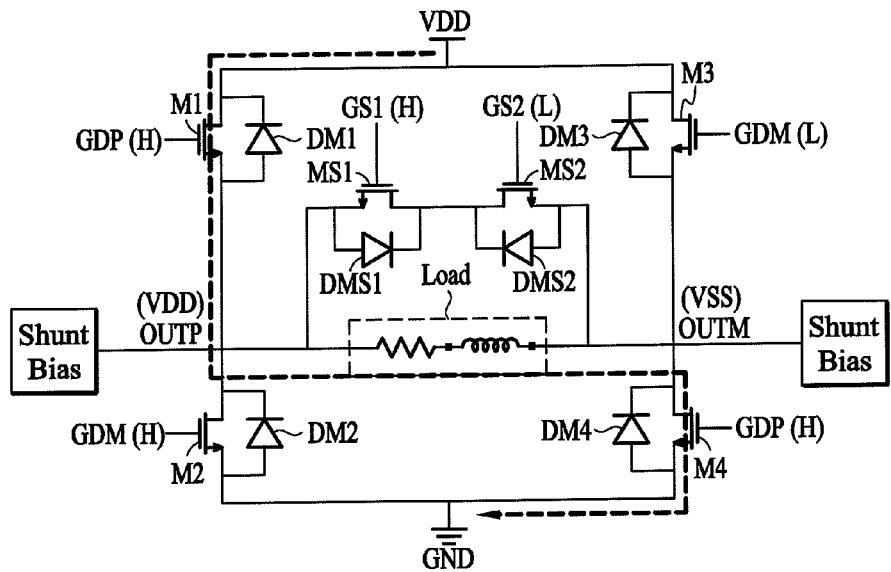
FIG. 5A is a diagram of current flow in the switching circuit operating according to a state S2.
Figure 5B:
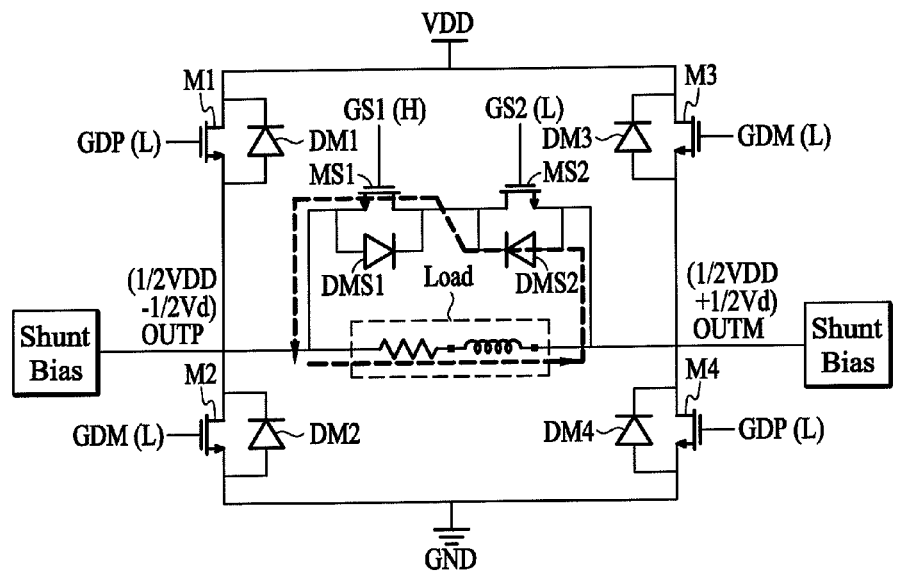
FIG. 5B is a diagram of current flow in the switching circuit operating according to a state S1.
Figure 5C:
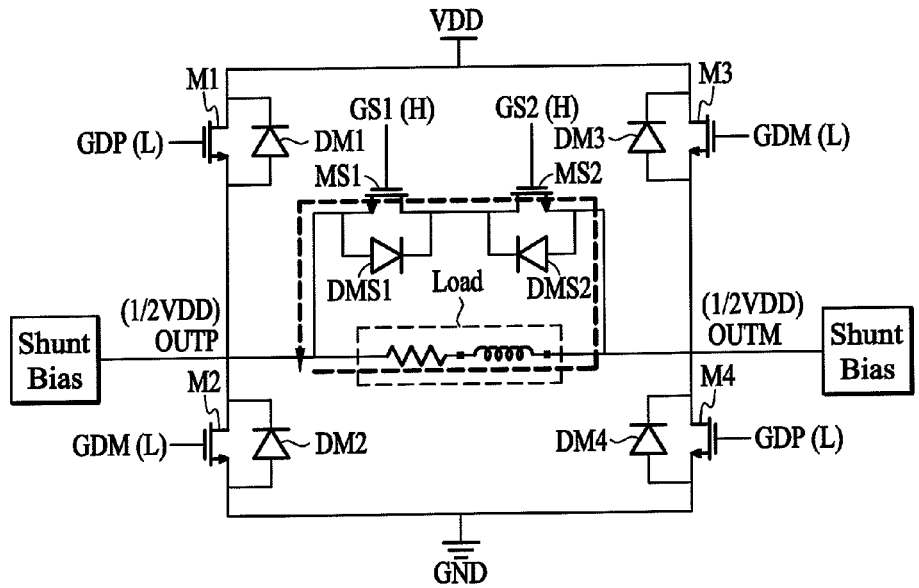
FIG. 5C is a diagram of current flow in the switching circuit operating according to a state S0.

FIGS. 5A, 5B, and 5C show the current flow of transition from the state S2 through the state S1 to the state S0 when the current through the load flows from the node OUTP to the node OUTM. Referring to FIG. 5A, a diagram of current flow in the switching circuit operating according to a state S2 is shown. When the switching circuit operates according to the state S2, the control signal GDP turns on the switches M1 and M4, the control signal GDM turns off the switches M2 and M3, the control signals GS1 and GS2 turn off the shunt switches MS1 and MS2, and a current therefore flows from the voltage source VDD through the switch M1, the load, and the switch M4 to the ground GND. The voltage on the output node OUTP is equal to VDD and the voltage on the output node OUTM is equal to GND.

Referring to FIG. 5B, a diagram of current flow in the switching circuit operating according to a state S1 is shown. When the switching circuit operates according to the state S1, the control signal GDP turns off the switches M1 and M4, the control signal GDM turns off the switches M2 and M3, the control signal GS1 turns on the shunt switch MS1, the control signal GS2 turns off the shunt switch MS2, and a current therefore circulates around the load, the body diode DMS2 of the shunt switch MS2, and the shunt switch MS1. The voltage on the output node OUTP is equal to ($\frac{1}{2}$VDD−$\frac{1}{2}$Vd) and the voltage on the output node OUTM is equal to ($\frac{1}{2}$VDD+$\frac{1}{2}$Vd), wherein Vd is the voltage across the body diode DMS2 and is typically much less than VDD.

Referring to FIG. 5C, a diagram of current flow in the switching circuit operating according to a state S0 is shown. When the switching circuit operates according to the state S0, the control signal GDP turns off the switches M1 and M4, the control signal GDM turns off the switches M2 and M3, the control signal GS1 turns on the shunt switch MS1, and the control signal GS2 turns on the shunt switch MS2. A current therefore circulates around the load, the shunt switch MS2, and the shunt switch MS1. The voltage on the output node OUTP is equal to $\frac{1}{2}$VDD and the voltage on the output node OUTM is equal to $\frac{1}{2}$VDD.

Figure 5D:
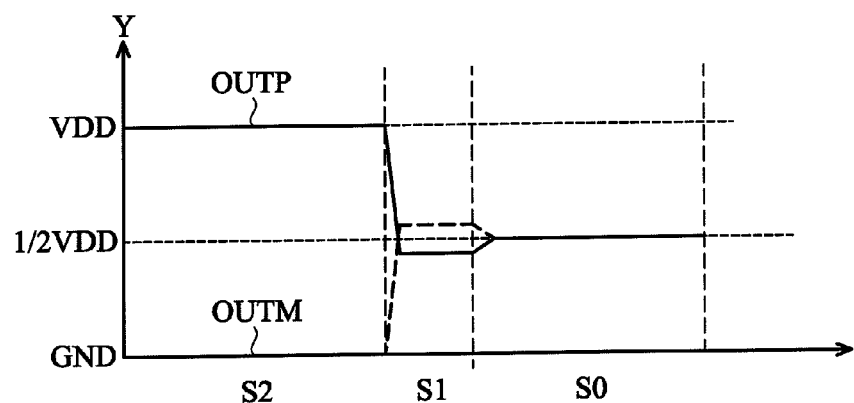
FIG. 5D is a diagram of the voltages on the output nodes of the switching circuit when a current state changes from the state S2 through the state S1 to the state S0.

Referring to FIG. 5D, a diagram of the voltages on the output nodes OUTP and OUTM when a current state of the switch circuit changes from the state S2 through the state S1 to the state S0 is shown. When the switching circuit operates according to the state S2, the voltages on the output nodes OUTP and OUTM are respectively VDD and GND. When the switching circuit operates according to the state S1, the voltages on the output nodes OUTP and OUTM are respectively ($\frac{1}{2}$VDD−$\frac{1}{2}$Vd) and ($\frac{1}{2}$VDD+$\frac{1}{2}$Vd). When the switching circuit operates according to the state S0, the voltages on the output nodes OUTP and OUTM are both $\frac{1}{2}$VDD. In comparison with FIG. 2E, the rapid voltage transition in the dead period SD disappears, and EMI is therefore reduced to improve performance of the switching circuit.

Figure 6A:
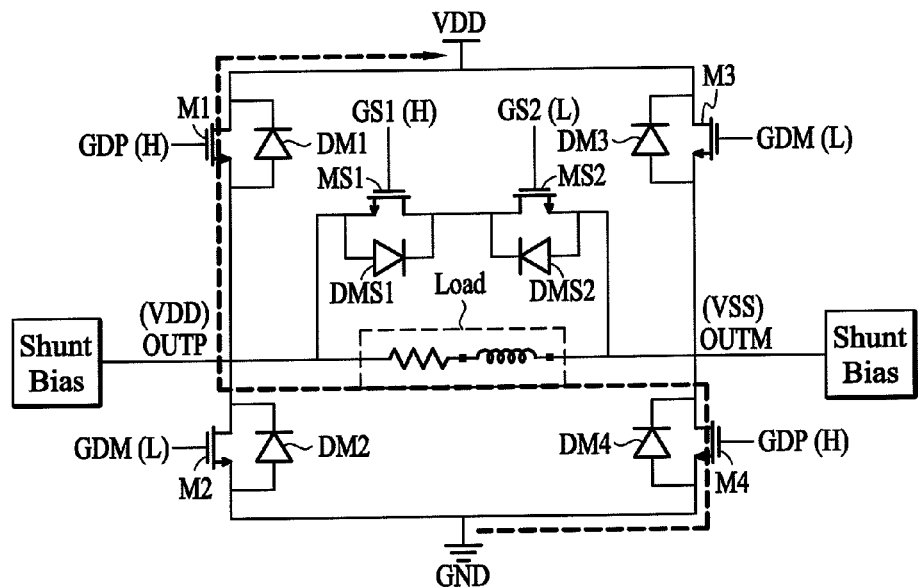
FIG. 6A is a diagram of another embodiment of current flow in the switching circuit operating according to a state S2.
Figure 6B:
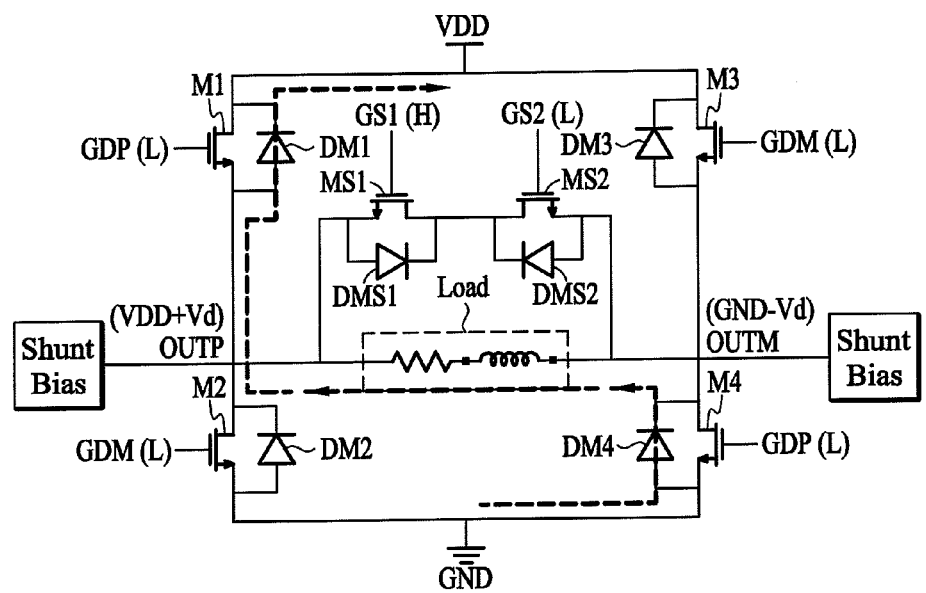
FIG. 6B is a diagram of another embodiment of current flow in the switching circuit operating according to a state S1.
Figure 6C:
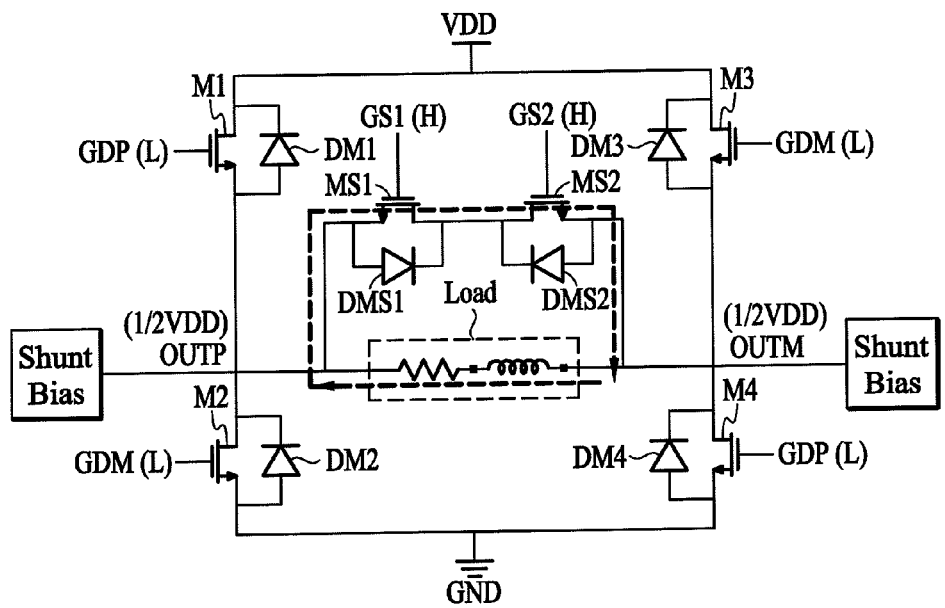
FIG. 6C is a diagram of another embodiment of current flow in the switching circuit operating according to a state S0.

FIGS. 6A, 6B, and 6C show the current flow of transition from the state S2 through the state S1 to the state S0 when the current through the load flows from the node OUTM to the node OUTP. Referring to FIG. 6A, a diagram of current flow in the switching circuit operating according to a state S2 is shown. When the switching circuit operates according to the state S2, a current flows from the ground GND through the switch M4, the load, and the switch M1 to the voltage source VDD. The voltage on the output node OUTP is equal to VDD and the voltage on the output node OUTM is equal to GND. Referring to FIG. 6B, a diagram of current flow in the switching circuit operating according to a state S1 is shown. When the switching circuit operates according to the state S1, a current sequentially passes from the ground GND through the body diode DM4 of the switch M4, the load, the body diode DM1 of the switch M1 to the voltage source VDD. The voltage on the output node OUTP is equal to (VDD+Vd) and the voltage on the output node OUTM is equal to (GND−Vd), wherein Vd is the voltage across the body diode DM4 or DM1.

Referring to FIG. 6C, a diagram of current flow in the switching circuit operating according to a state S0 is shown. When the switching circuit operates according to the state S0, the control signal GS1 turns on the shunt switch MS1, and the control signal GS2 turns on the shunt switch MS2. A current therefore circulates around the load, the shunt switch MS1, and the shunt switch MS2. The voltage on the output node OUTP is equal to $\frac{1}{2}$VDD and the voltage on the output node OUTM is also equal to $\frac{1}{2}$VDD.

Figure 6D:
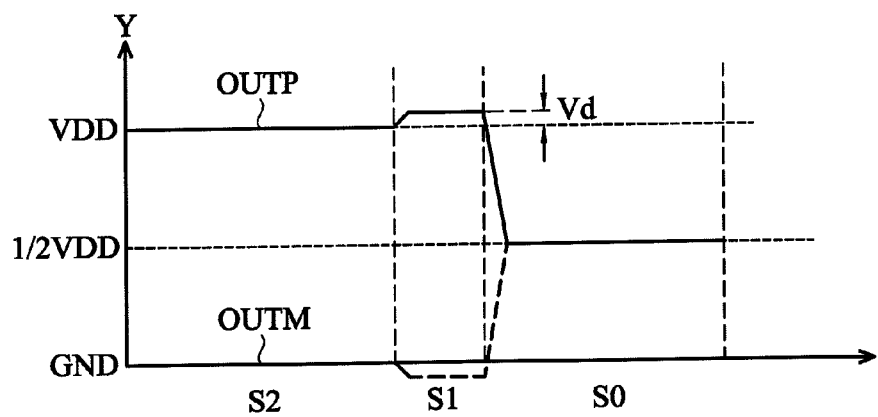
FIG. 6D is a diagram of another embodiment of the voltages on the output nodes of the switching circuit when a current state changes from the state S2 through the state S1 to the state S0.

Referring to FIG. 6D, a diagram of the voltages on the output nodes OUTP and OUTM when a current state of the switch circuit changes from the state S2 through the state S1 to the state S0 is shown. When the switching circuit operates according to the state S2, the voltages on the output nodes OUTP and OUTM are respectively VDD and GND. When the switching circuit operates according to the state 51, the voltages on the output nodes OUTP and OUTM are respectively (VDD+Vd) and (GND−Vd). When the switching circuit operates according to the state S0, the voltages on the output nodes OUTP and OUTM are both $\frac{1}{2}$VDD. In comparison with FIG. 2E, the rapid voltage transition in the dead period SD disappears, and EMI is therefore reduced to improve performance of the switching circuit.

Figure 7B:
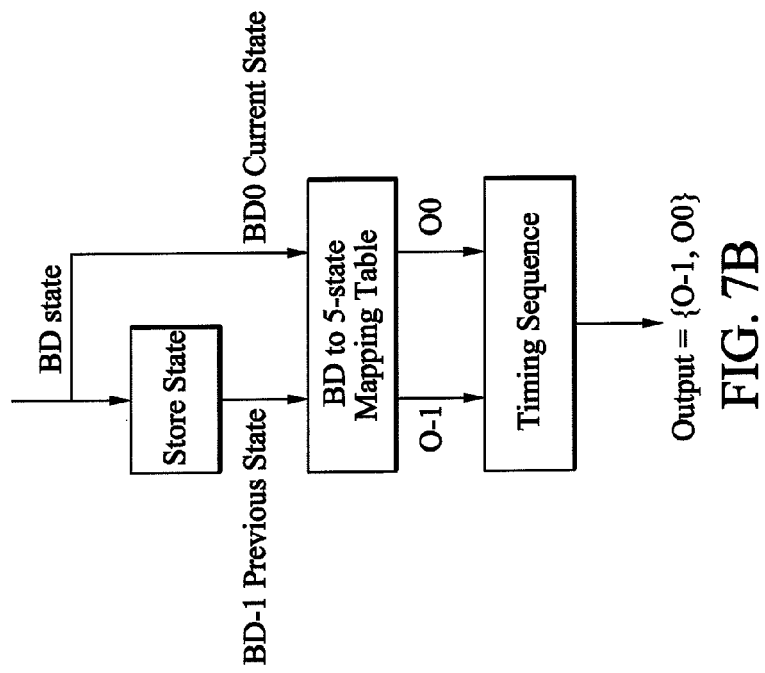
FIG. 7B shows a state coding circuit which transforms a BD coding state to the state of the switching circuit of the invention.
Figure 7A:
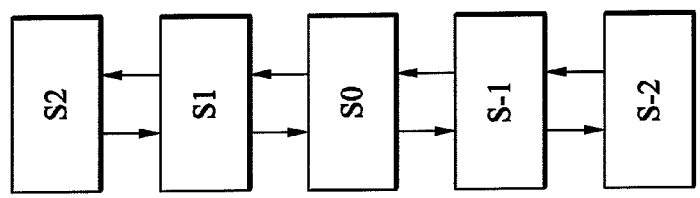
FIG. 7A shows a diagram of state transition of the switching circuit according to the invention.

FIG. 7A shows a diagram of state transition of the switching circuit according to the invention. For tri-level BD modulation, the state transition is always between S2 and S0 or S-2 and S0. In this proposal, a State S1 is inserted between S2 and S0, and State S-1 is inserted between S0 and S-2. Because an intermediate state S1 is inserted between the states S2 and S0 and an intermediate state S-1 is inserted between the states S0 and S-2. In states S1 and S-1, the current router MS1 and MS2 steering the current properly from OUTM to OUTP (for State S1) or from OUTP to OUTM (for State S-1) such that there is no sudden voltage jump on the output nodes OUTP and OUTM of the switching circuit during state transition, and EMI is therefore reduced. When a current state is the state S2, the state of the switching system is first changed to the state S1, and then to the state S0. When the current state is the state S-2, the state of the switching system is first changed to the state S-1, and then to the state S0. When the current state is the state S0, the state of the switching system may be sequentially changed to the state S1 and then to the state S2 or be sequentially changed to the state S-1 and then to the state S-2.

FIG. 7B shows an algorithm which transforms a BD coding state to the state of the switching circuit of the invention. There are four possible state transitions in BD coding. The state coding circuit first stores a previous BD coding state, BD-1, and a current BD coding state, BD0, and then generates an intermediate state, O-1, and the final state O0 of the switching circuit according to a state mapping table. Notice that O0=BD0. The state coding circuit converts the BD coding state to the state of the switching circuit according to the following state mapping table:

| BD coding (BD-1 -> BD0) | 5-state Coding (BD-1 -> O-1 -> O0) |
|---|---|
| S2→S0 | S2→S1→S0 |
| S-2→S0 | S-2→S-1→S0 |
| S0→S2 | S0→S1→S2 |
| S0→S-2 | S0→S-1→S-2 |

Figure 7C:
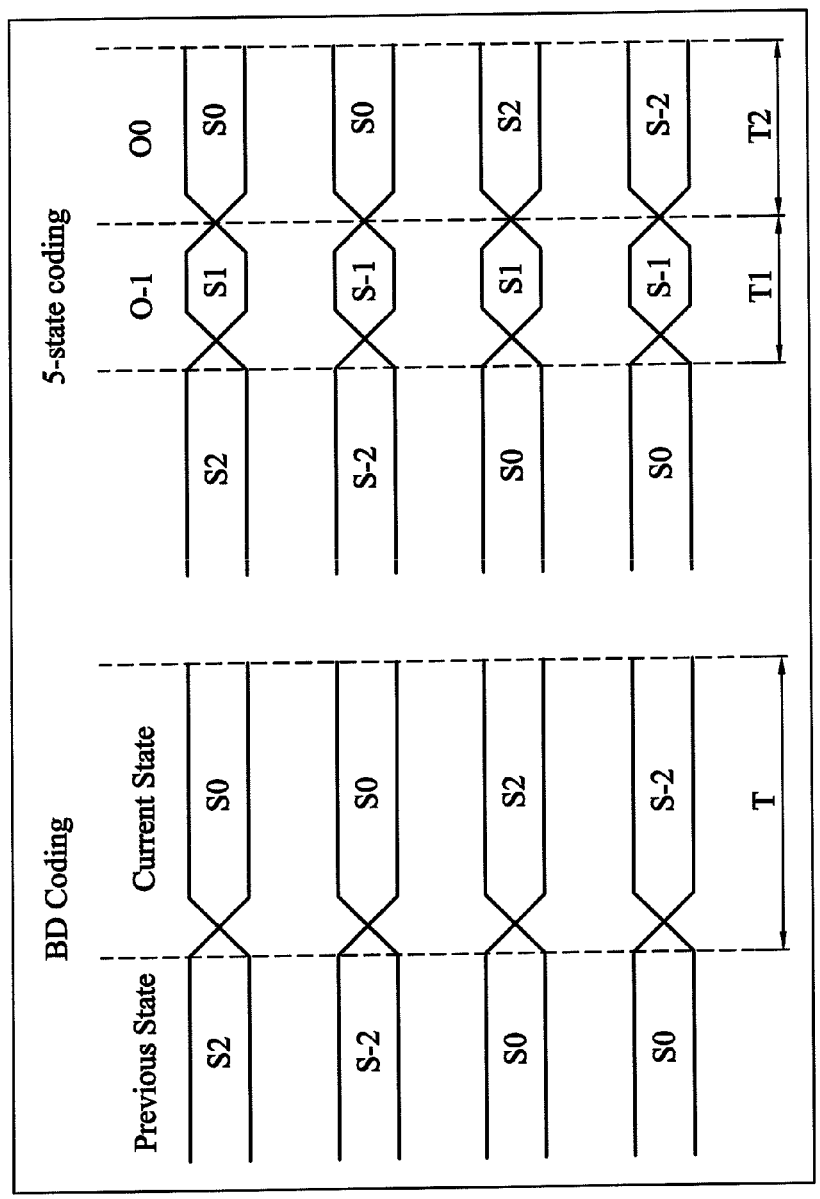
FIG. 7C shows the corresponding relationship between the states of BD coding and the transformed state of the switching circuit of the invention.

The outputs are then sequenced according to FIG. 7C. In the diagram, the original switching period in BD coding is T. In 5-state coding, the same period is separated into T1 and T2. T=T1+T2. T1 is used by the intermediate states S1 and S2. Typically T1 is chosen to be much smaller than T2 to minimize distortion.

Figure 8:
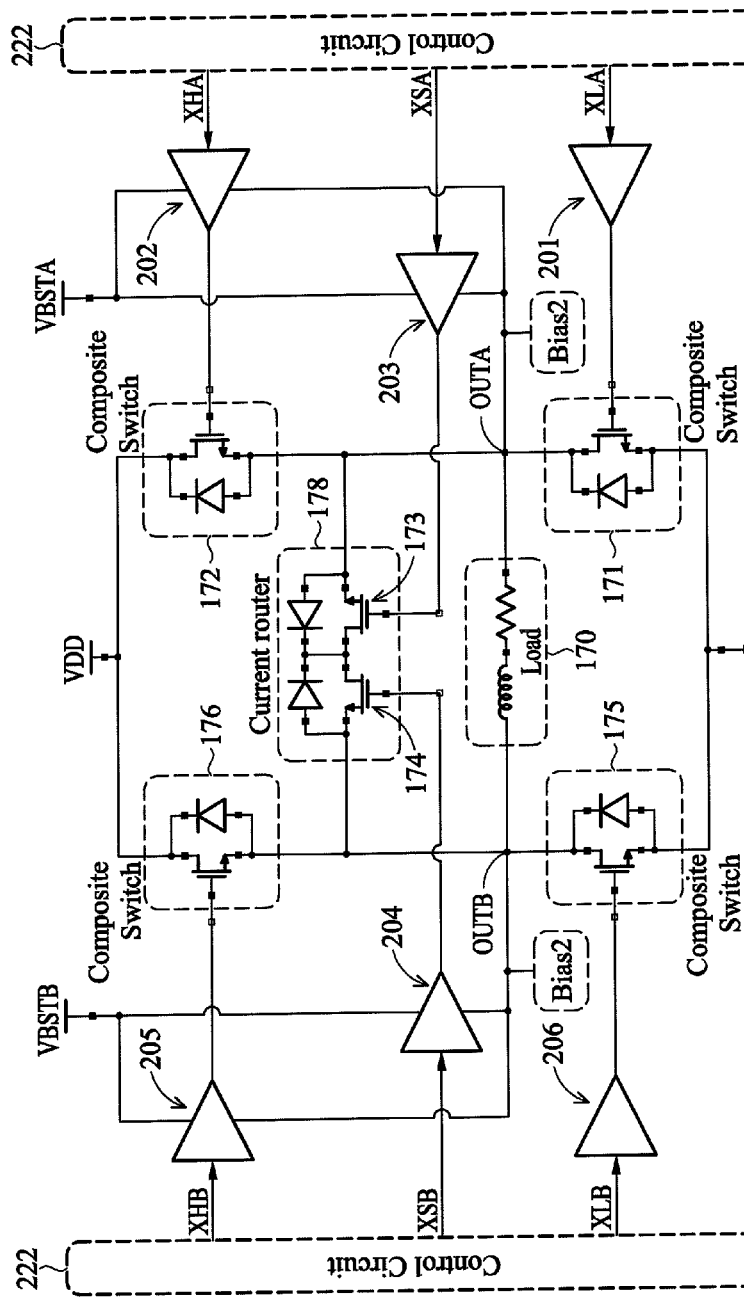
FIG. 8 is a circuit diagram of a switching system according to the invention.

Referring to FIG. 8, a circuit diagram of a switching system according to the invention is shown. The switching system comprises a control circuit 222, an H bridge comprising the switches 171, 172, 175, and 176, and a current router 178 comprising the shunt switches 173 and 174. A load 170 is coupled between the output nodes OUTB and OUTA of the H bridge. The control circuit 222 generates control signals XHB, XLB, XHA, XLA to control the switches 176, 175, 172, and 171. The control circuit 222 also generates control signals XSB and XSA to control the shunt switches 174 and 173.

Figure 9A:
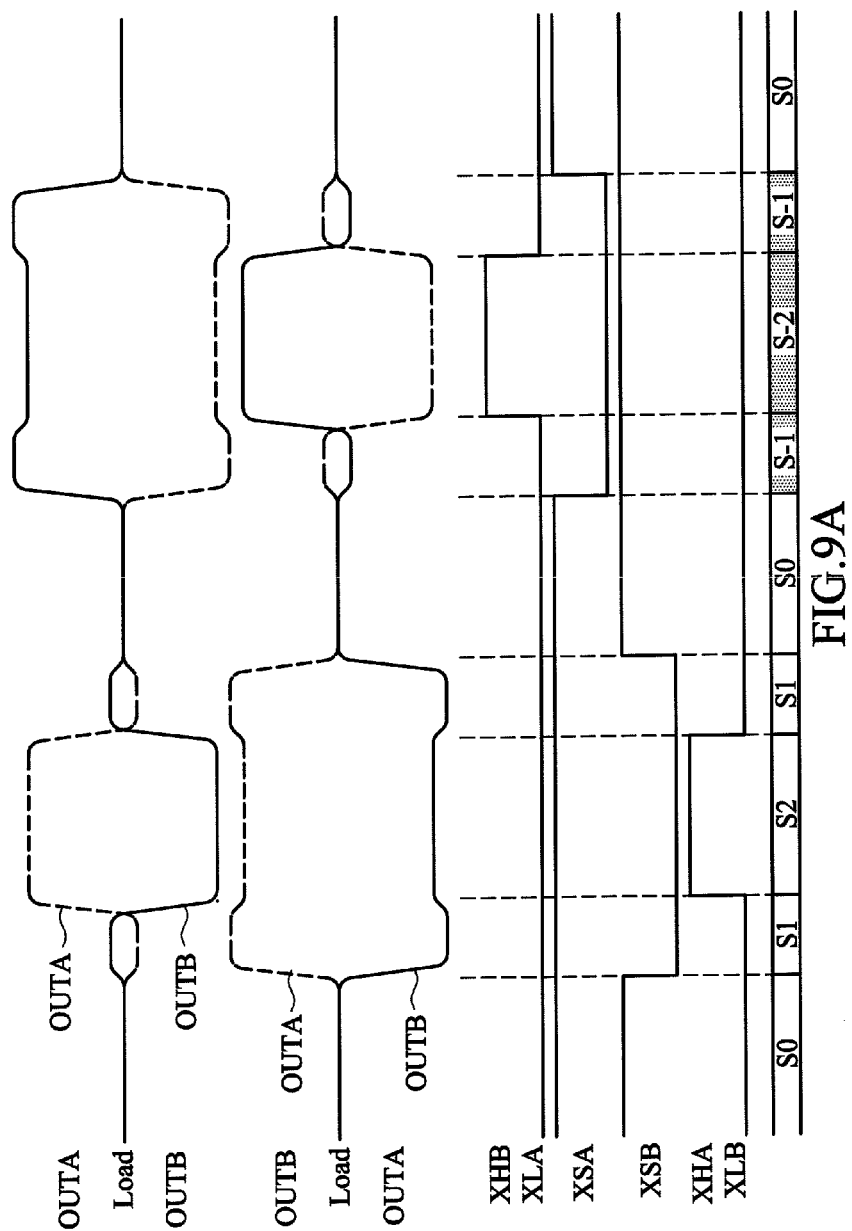
FIG. 9A is a diagram of voltages of the control signals XHB, XLA, XSA, XSB, XHA, and XLB corresponding to different states according to the invention.
Figure 9B:
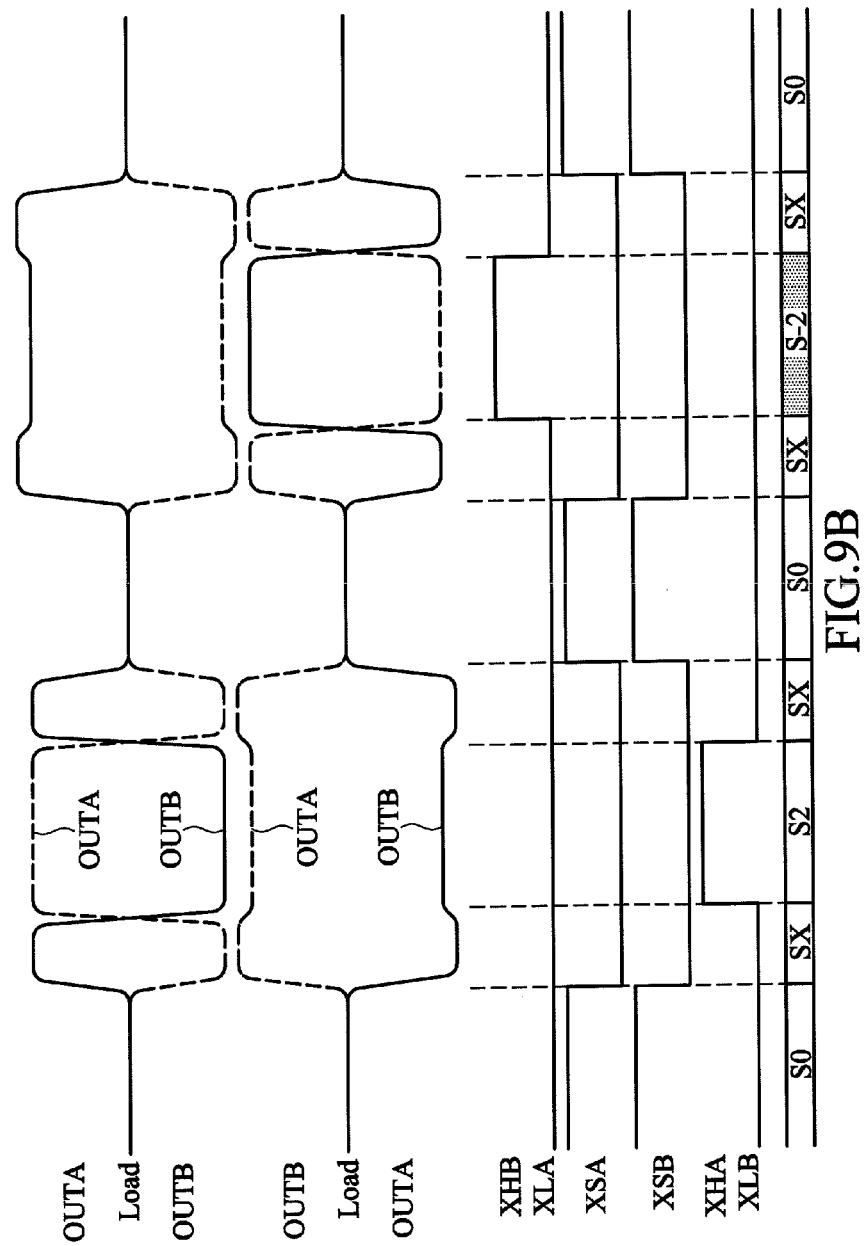
FIG. 9B shows a diagram of voltages of output nodes of the H bridge of as shown in FIG. 2A.

The operation of the switching system shown in FIG. 8 is the same as that of the switching circuit shown in FIG. 3. Referring to FIG. 9A, a diagram of voltages of the control signals XHB, XLA, XSA, XSB, XHA, and XLB corresponding to different states according to the invention is shown. In this example, the current state of the switching system sequentially changes from S0 through S1, S2, S1, S0, S-1, S-2, and S-1 back to S0. In the case when the inductor current direction is from OUTP to OUTM, the current router directs the current properly in inserted states S1 and S-1 such that the voltages on the output nodes OUTA and OUTB of the switching system is shown on the upward portion of FIG. 9A. In the case when the inductor current direction is from OUTM to OUTP, the voltages on the output nodes OUTA and OUTB of the switching system is shown on the medium portion of FIG. 9A. FIG. 9B shows a diagram of voltages of output nodes of the improved H bridge as shown in FIG. 2A. The improved H bridge does not have the current router function as this invention has, hence deadline needs to be inserted between state transitions and they are marked as SX in FIG. 9B. The output nodes OUTA and OUTB show rapid transitions as illustrated in FIG. 2E. In comparison with FIG. 9B, the level of voltage fluctuation of the switching system shown in FIG. 9A is small, and EMI is therefore reduced to improve the performance of the switching system of the invention.

Figure 10:
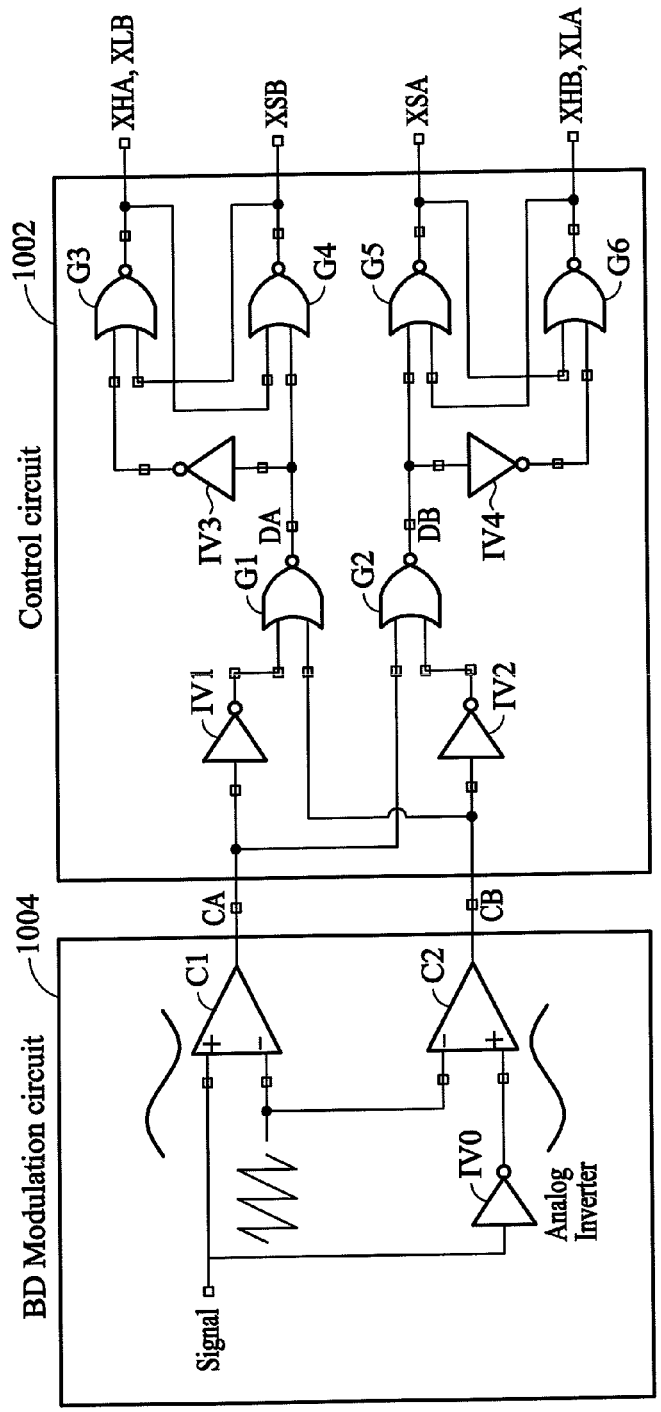
FIG. 10 a block diagram of a BD modulation circuit and a control circuit according to the invention.
Figure 11A:
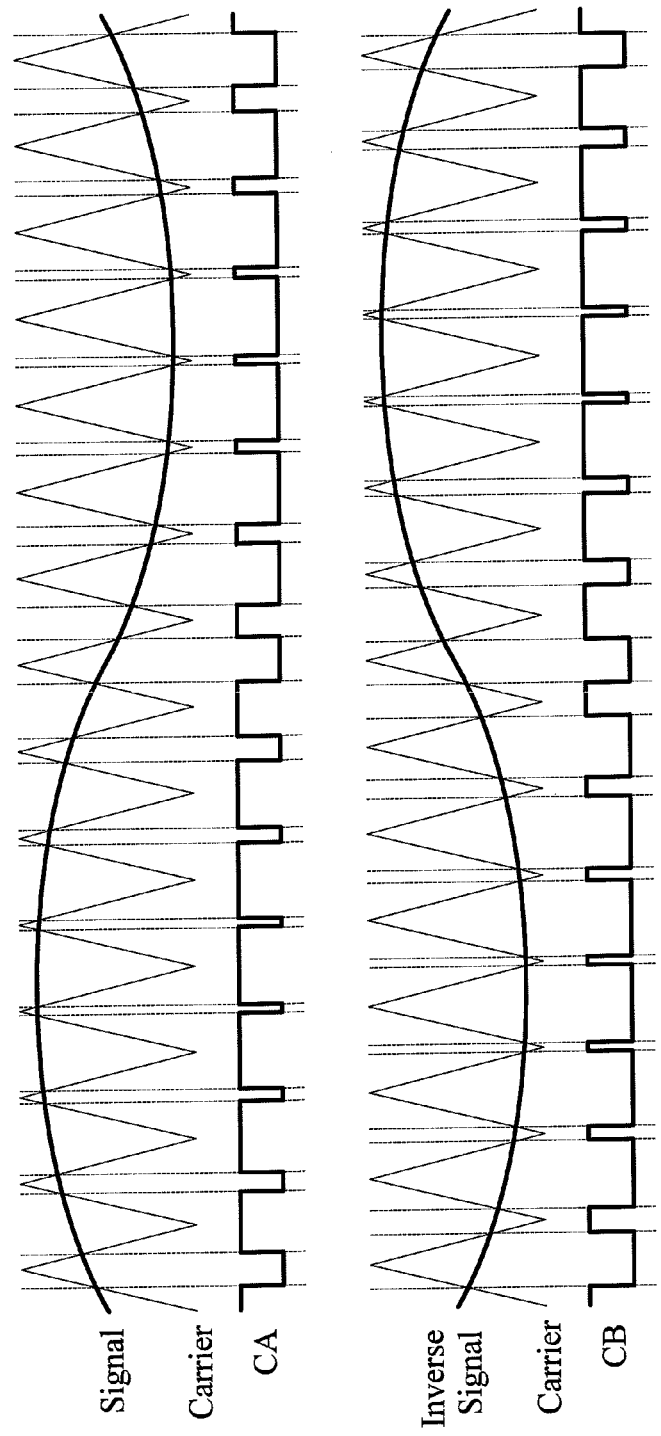
FIG. 11A shows an input signal, a carrier wave, and BD modulation signals CA and CB generated by the BD modulation circuit according to the invention.

Referring to FIG. 10, a block diagram of a BD modulation circuit 1004 and a control circuit 1002 according to the invention is shown. The BD modulation circuit 1004 generates BD modulation signals CA and CB according to an input signal and a carrier wave. In one embodiment, the BD modulation circuit 1004 comprises an inverter IV0 and two comparators C1 and C2. The inverter IV0 inverts the input signal to generate an inverse input signal. The comparator C1 compares the input signal with the carrier wave to generate a BD modulation signal CA. The comparator C2 compares the inverse input signal with the carrier wave to generate a BD modulation signal CB. FIG. 11A shows the input signal, the carrier wave, and the BD modulation signals CA and CB generated by the BD modulation circuit according to the invention.

Figure 11B:
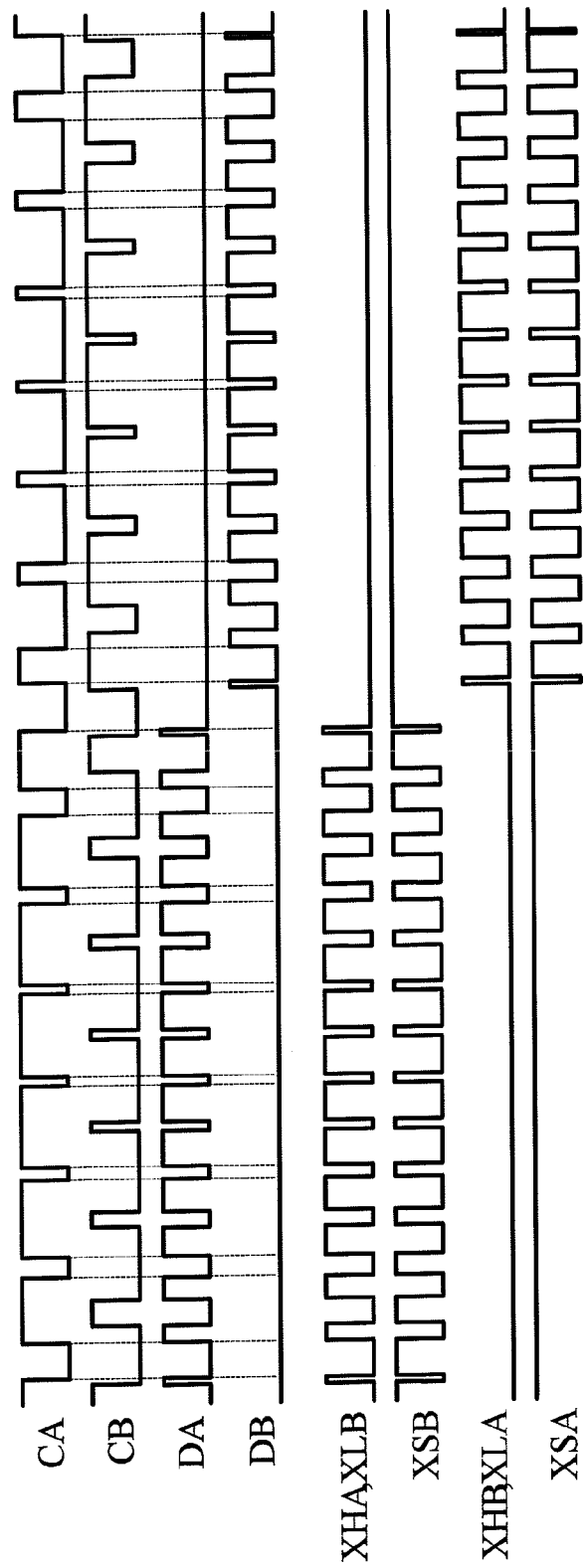
FIG. 11B shows the waveforms of BD modulation signals CA and CB, signals DA and DB, and the control signals XHA, XHB, XSB, XHB, XLA, and XSA.

The control circuit 1002 then generates the control signals XHA, XLB, XSH, XSA, XHB, XLA according to the BD modulation signals CA and CB to control the switches 171, 172, 176, 175 of the H bridge and shunt switches 174 and 173 of the current router 178 shown in FIG. 8. In one embodiment, the Control circuit 1002 comprises inverters IV1, IV2, IV3, and IV4 and NOR gates G1, G2, G3, G4, G5, and G6. The inverter IV1 inverts the BD modulation signal CA to generate a first signal. The inverter IV2 inverts the BD modulation signal CB to generate a second signal. The NOR gate G1 performs an NOR operation on the first signal and the BD modulation signal CB to obtain a third signal DA. The NOR gate G2 performs an NOR operation on the BD modulation signal CA and the second signal to obtain a fourth signal DB. The inverter IV3 inverts the third signal DA to obtain an inverse third signal. The inverter IV4 inverts the fourth signal DB to obtain an inverse fourth signal. The NOR gate G3 performs an NOR operation on the inverse third signal and the control signal XSB to obtain the control signals XHA and XLB. The NOR gate G4 performs an NOR operation on the third signal and the control signal XHA to obtain the control signal XSB. The NOR gate G5 performs an NOR operation on the fourth signal and the control signal XHB to obtain the control signal XSA. The NOR gate G6 performs an NOR operation on the inverse fourth signal and the control signal XSA to obtain the control signals XHB and XLA. FIG. 11B shows the waveforms of the BD modulation signals CA and CB, the signals DA and DB, and the control signals XHA, XHB, XSB, XHB, XLA, and XSA.

The current router shown in FIG. 3 and FIG. 8 operates according to a current state selected from four operation states. FIGS. 12A, 12B, 12C, and 12D shows current flow of four operation states of a current router according to the invention. The current router comprises two shunt switches MS1 and MS2 and two body diodes DMS1 and DMS2 of the shunt switches MS1 and MS2, wherein the direction of the body diode DMS1 is inverse to that of the body diode DMS2. According to a first state shown in FIG. 12A, a control signal GS1 turns on the shunt switch MS1, and a control signal GS2 turns on the shunt switch MS2. A current path through the shunt switches MS1 and MS2 is therefore formed, and the current may flow from the shunt switch MS2 to the shunt switch MS1 or from the shunt switch MS1 to the shunt switch MS2. According to a second state shown in FIG. 12B, a control signal GS1 turns off the shunt switch MS1, and a control signal GS2 turns off the shunt switch MS2. No current path is formed, and no current can flow through the shunt switches MS1 and MS2.

Figure 12B:
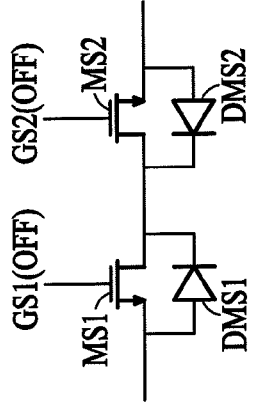
FIGS. 12A, 12B, 12C, and 12D shows current flow of four operation states of a current router according to the invention.
Figure 12D:
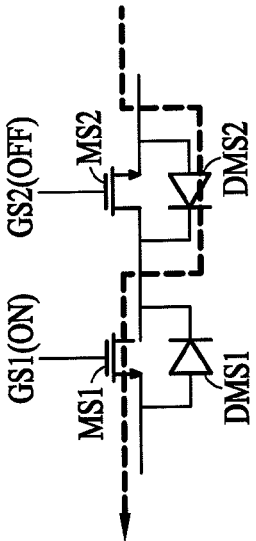
Figure 12A:
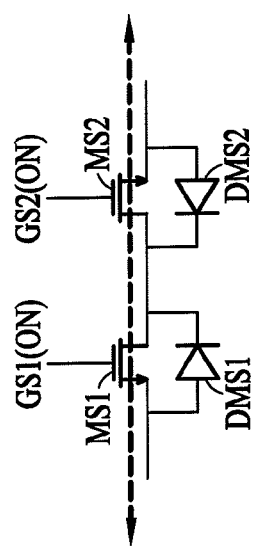
Figure 12C:
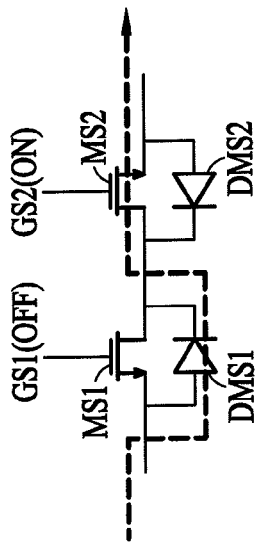

According to a third state shown in FIG. 12C, a control signal GS1 turns off the shunt switch MS1, and a control signal GS2 turns on the shunt switch MS2. A current path through the body diode DMS1 and the shunt switch MS2 is therefore formed, and the current can only flow from the body diode DMS1 to the shunt switch MS2. According to a fourth state shown in FIG. 12D, a control signal GS1 turns on the shunt switch MS1, and a control signal GS2 turns off the shunt switch MS2. A current path through the body diode DMS2 and the shunt switch MS1 is therefore formed, and the current can only flow from the body diode DMS2 to the shunt switch MS1.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A switching system, comprising:
    an H bridge, comprising a first switch and a second switch coupled to a first output node and a third switch and a fourth switch coupled to a second output node, wherein a load is coupled between the first output node and the second output node;
    a current router, comprising a first shunt switch and a second shunt switch coupled between the first output node and the second output node; and
    a control circuit, generating a first control signal to control the first switch and the fourth switch, generating a second control signal to control the second switch and the third switch, generating a third control signal to control the first shunt switch, and generating a fourth control signal to control the second shunt switch,
    wherein the control circuit comprises:
        a first inverter, inverting a first signal to generate an inverse first signal;
        a second inverter, inverting a second signal to generate an inverse second signal;
        a first NOR gate, performing an NOR operation on the inverse first signal and the second signal to obtain a third signal;
        a second NOR gate, performing an NOR operation on the first signal and the inverse second signal to obtain a fourth signal;
        a third inverter, inverting the third signal to obtain an inverse third signal;
        a fourth inverter, inverting the fourth signal to obtain an inverse fourth signal;
        a third NOR gate, performing an NOR operation on the inverse third signal and the third control signal to obtain the second control signal;
        a fourth NOR gate, performing an NOR operation on the third signal and the second control signal to obtain the third control signal;
        a fifth NOR gate, performing an NOR operation on the fourth signal and the first control signal to obtain the fourth control signal; and
        a sixth NOR gate, performing an NOR operation on the inverse fourth signal and the fourth control signal to obtain the first control signal.

2. The switching system as claimed in claim 1, wherein the switching system further comprises a BD modulation circuit, comprising:
    a seventh inverter, inverting an input signal to obtain an inverse input signal;
    a first comparator, comparing the input signal with a carrier wave to generate the first signal; and
    a second comparator, comparing the inverse input signal with the carrier wave to generate the second signal.

3. The switching system as claimed in claim 1, wherein the H bridge comprises:
    the first switch, coupled between a voltage source and the first output node, having a gate coupled to the first control signal;
    the second switch, coupled between the first output node and a ground, having a gate coupled to the second control signal;
    the third switch, coupled between the voltage source and the second output node, having a gate coupled to the second control signal; and
    the fourth switch, coupled between the second output node and the ground, having a gate coupled to the first control signal.

4. The switching system as claimed in claim 1, wherein the current router comprises:
    the first shunt switch, coupled between the first output node and a first node, having a gate coupled to the third control signal; and
    the second shunt switch, coupled between the second output node and the first node, having a gate coupled to the fourth control signal,
    wherein the body diode of the first shunt switch has a direction inverse to that of the body diode of the second shunt switch.

5. The switching system as claimed in claim 1, wherein except for a zero state in which the first shunt switch and the second shunt switch are both turned on, the third control signal turns on the first shunt switch when the fourth control signal turns off the second shunt switch, and the third control signal turns off the first shunt switch when the fourth control signal turns on the second shunt switch.

6. The switching system as claimed in claim 1, wherein when the switching system operates according to a current state selected from a zero state, a first state, a second state, an inverse first state, and an inverse second state,
    wherein when the current state is the first state, the first control signal turns off the first switch and the fourth switch, the second control signal turns off the second switch and the third switch, the third control signal turns on the first shunt switch, and the fourth control signal turns off the second shunt switch, and
    wherein when the current state is the inverse first state, the first control signal turns off the first switch and the fourth switch, the second control signal turns off the second switch and the third switch, the third control signal turns off the first shunt switch, and the fourth control signal turns on the second shunt switch.

7. The switching system as claimed in claim 6, wherein when the current state is the second state, the first control signal turns on the first switch and the fourth switch, the second control signal turns off the second switch and the third switch, the third control signal turns on the first shunt switch, and the fourth control signal turns off the second shunt switch,
    wherein when the current state is the inverse second state, the first control signal turns off the first switch and the fourth switch, the second control signal turns on the second switch and the third switch, the third control signal turns off the first shunt switch, and the fourth control signal turns on the second shunt switch,
    wherein when the current state is the zero state, the first control signal turns off the first switch and the fourth switch, the second control signal turns off the second switch and the third switch, the third control signal turns on the first shunt switch, and the fourth control signal turns on the second shunt switch,
    when the current state is the second state, the state of the switching system is first changed to the first state, then to the zero state, then to the inverse first state, and then to the inverse second state; and when the current state is the inverse second state, the state of the switching system is first changed to the inverse first state, then to the zero state, then to the first state, and then to the second state.

\* \* \* \* \*